US 10,990,015 B2

United States Patent
Riepen et al.

(10) Patent No.: US 10,990,015 B2
(45) Date of Patent: Apr. 27, 2021

(54) DEBRIS MITIGATION SYSTEM, RADIATION SOURCE AND LITHOGRAPHIC APPARATUS

(71) Applicant: ASML Netherlands B.V., Veldhoven (NL)

(72) Inventors: Michel Riepen, Veldhoven (NL); Paul Peter Anna Antonius Brom, Eindhoven (NL); Ronald Johannes Hultermans, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 73 days.

(21) Appl. No.: 16/318,303

(22) PCT Filed: Jun. 22, 2017

(86) PCT No.: PCT/EP2017/065409
§ 371 (c)(1),
(2) Date: Jan. 16, 2019

(87) PCT Pub. No.: WO2018/019494
PCT Pub. Date: Feb. 1, 2018

(65) Prior Publication Data
US 2019/0265594 A1    Aug. 29, 2019

(30) Foreign Application Priority Data

Jul. 25, 2016   (EP) .................................. 16181066

(51) Int. Cl.
| | | |
|---|---|---|
| *G03F 7/00* | (2006.01) | |
| *G03F 7/20* | (2006.01) | |
| *H05G 2/00* | (2006.01) | |

(52) U.S. Cl.
CPC ........ *G03F 7/70033* (2013.01); *G03F 7/7095* (2013.01); *G03F 7/70916* (2013.01);
(Continued)

(58) Field of Classification Search
CPC .............. G03F 7/70033; G03F 7/7095; G03F 7/70916; G03F 7/70958; H05G 2/005; H05G 2/003; H05G 2/00
(Continued)

(56) References Cited

U.S. PATENT DOCUMENTS 8,519,367 B2 *   8/2013   Metzmacher ..........   H05G 2/003
                                                       250/504 R
8,721,778 B2 *   5/2014   Metzmacher .......   G03F 7/70916
                                                          96/392
(Continued)

FOREIGN PATENT DOCUMENTS

WO   WO 2006/093687 A1   9/2006
WO   WO 2011/033447 A1   3/2011
(Continued)

OTHER PUBLICATIONS

International Search Report and Written Opinion of the International Searching Authority directed to related International Patent Application No. PCT/EP2017/065409, dated Jan. 12, 2018; 17 pages.

*Primary Examiner* — Michael Maskell
(74) *Attorney, Agent, or Firm* — Sterne, Kessler, Goldstein & Fox P.L.L.C.

(57) ABSTRACT

A debris mitigation system for use in a radiation source. The debris mitigation system comprises a contamination trap. The contamination trap comprises a debris receiving surface arranged to receive liquid metal fuel debris emitted from a plasma formation region of the radiation source. The debris receiving surface is constructed from a material that reacts with the liquid metal fuel debris to form an intermetallic layer on the debris receiving surface.

20 Claims, 4 Drawing Sheets

(52) U.S. Cl.
CPC ......... *G03F 7/70958* (2013.01); *H05G 2/003* (2013.01); *H05G 2/005* (2013.01)

(58) Field of Classification Search
USPC ..................... 250/492.1–492.3, 493.1, 504 R
See application file for complete search history.

(56) References Cited

U.S. PATENT DOCUMENTS

| | | | | |
|---|---|---|---|---|
| 2008/0143981 A1* | 6/2008 | Ehm | ....................... | B82Y 10/00 |
| | | | | 355/30 |
| 2012/0248343 A1* | 10/2012 | Nagai | .................... | H05G 2/003 |
| | | | | 250/504 R |

FOREIGN PATENT DOCUMENTS

| | | | |
|---|---|---|---|
| WO | WO 2014/075881 A1 | 5/2014 | |
| WO | WO 2015/055374 A1 | 4/2015 | |

* cited by examiner

DEBRIS MITIGATION SYSTEM, RADIATION SOURCE AND LITHOGRAPHIC APPARATUS

CROSS-REFERENCE TO RELATED APPLICATIONS

This application claims priority of EP application 16181066.8 which was filed on Jul. 25, 2016 and which is incorporated herein in its entirety by reference

FIELD

The present invention relates to a lithographic method and apparatus, and particularly but not exclusively to a method of correcting aberrations caused by a projection system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation source for producing EUV radiation may excite a fuel to generate a plasma which emits EUV radiation. The plasma may be created, for example, by directing a laser beam at a fuel, such as droplets of a suitable material (e.g., tin), or a stream of a suitable gas or vapor, such as Xe gas or Li vapor. EUV radiation emitted by the plasma is collected using a radiation collector, which receives the EUV radiation and focuses the EUV radiation into a beam. The radiation source may include an enclosing housing or chamber arranged to provide a vacuum environment for the plasma. A radiation source which uses a laser beam in this way is typically termed a laser produced plasma (LPP) source.

In addition to generation of plasma, exciting the fuel may also result in the unwanted generation of particulate debris from the fuel. For example, where a liquid metal, such as tin, is used as a fuel, some of the liquid metal fuel will be converted into an EUV producing plasma, but debris particles of the liquid metal fuel may be emitted at high speeds from the plasma formation region. The debris may be incident on other components within the radiation source, affecting the ability of the radiation source to generate an EUV producing plasma or to provide a beam of EUV radiation from the plasma to other components of the lithographic apparatus. The debris may also travel beyond the radiation source and become incident on other components of the lithographic apparatus.

SUMMARY

It is desirable to obviate or mitigate one or more of the problems set out above.

According to a first aspect described herein, there is provided a debris mitigation system for use in a radiation source. The debris mitigation system comprises a contamination trap. The contamination trap comprises a debris receiving surface arranged to receive liquid metal fuel debris emitted from a plasma formation region of the radiation source. The debris receiving surface is constructed from a material that reacts with the liquid metal fuel debris to form an intermetallic layer on the debris receiving surface.

By constructing the debris receiving surface from a material that reacts with the liquid metal fuel debris to form an intermetallic layer, at least some of the liquid metal debris is "used up" in the reaction rather than forming a liquid film which may drip from, or otherwise be ejected from, the debris receiving surface. In this way, contamination of optical components of the radiation source, or components of other systems in use with the source (e.g., a lithographic system) may be reduced.

The reaction may be such that substantially no liquid fuel drips from the debris receiving surface.

The debris receiving surface may be formed from a material which reacts with the liquid metal fuel debris at a rate of at least twice that at which the liquid metal fuel debris is deposited on the debris receiving surface. In this way, the reaction rate is sufficient to utilize substantially all liquid fuel debris and prevent contamination of other components.

A rate of reaction between the liquid metal fuel debris and the debris receiving surface may be greater than 0.15 μm per hour. In some embodiments, the rate of reaction between the liquid metal fuel debris and the debris receiving surface may be greater than 1 μm per hour or higher.

The intermetallic layer may have a melting point in excess of 200 degrees Celsius, and preferably a melting point in excess of 500 degrees Celsius. In this way, the intermetallic layer is unlikely to melt within the environment of the source, protecting the debris receiving surface and preventing further contamination from liquid fuel debris.

The debris receiving surface may be constructed from a material that reacts with tin to form an intermetallic layer. For example, the debris receiving surface may be constructed from at least one of iron, an iron alloy, carbon steel, nickel and copper.

The debris receiving surface may be formed with a porous structure. This increases the surface area of the debris receiving surface that is available for reaction, thereby speeding the reaction and reducing the likelihood that liquid fuel will be ejected from the debris receiving surface.

The debris receiving surface may comprise a plurality of vanes.

The debris receiving surface may be substantially smooth.

The debris receiving surface may further comprise a heat source source arranged to heat the debris receiving surface to an operating temperature of between 200-500 degrees Celsius. It has been found that by heating the debris receiving surface, the reaction rate with liquid fuel improves.

In a further embodiment described herein, there is provided a radiation source comprising a fuel emitter for providing a fuel target to a plasma formation region and a debris mitigation system according to the first aspect.

The fuel emitter may be arranged to emit liquid tin.

In another aspect described herein, there is provided a radiation system comprising a radiation source according to the first aspect and a first laser arranged to provide a first laser beam at the plasma formation region to impact a fuel target and generate a radiation emitting plasma.

In another aspect described herein, there is provided a lithographic system comprising a radiation source according to the first aspect, an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

In another embodiment described herein, there is provided a system. The system comprises a radiation source comprising a fuel emitter for providing a fuel target to a plasma formation region and/or a lithographic apparatus. Where the system comprises a lithographic apparatus, the lithographic apparatus comprises an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate. The radiation system comprises at least one surface that receives, during use, liquid metal fuel debris and the at least one surface comprises an intermetallic layer formed by boronization.

Where the lithographic comprises the radiation source, the at least one surface may comprise a surface of a debris mitigation system.

Where the lithographic system comprises the radiation source, the source may comprise a radiation collector and the at least one surface may comprises a surface of the radiation collector.

Where the lithographic system comprises the lithographic apparatus, the at least one surface may comprise an optical surface of an optical element of the lithographic apparatus, such as a mirror.

The intermetallic layer may comprise at least one selected from the list comprising: nickel monoboride (NiB), nickel boride ($Ni_2B$), iron monoboride (FeB), iron boride ($Fe_2B$), molybdenum monoboride (MoB), molybdenum boride ($Mo_2B$), cobalt monoboride (CoB), cobalt boride ($Co_2B$).

Features described in the context of one aspect described above may be used with others of the aspects described above.

BRIEF DESCRIPTION OF THE DRAWINGS

Embodiments of the invention will now be described, by way of example only, with reference to the accompanying schematic drawings, in which.

The features and advantages of the present invention will become more apparent from the detailed description set forth below when taken in conjunction with the drawings. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment (s). The invention is defined by the claims appended hereto.

Figure 1:
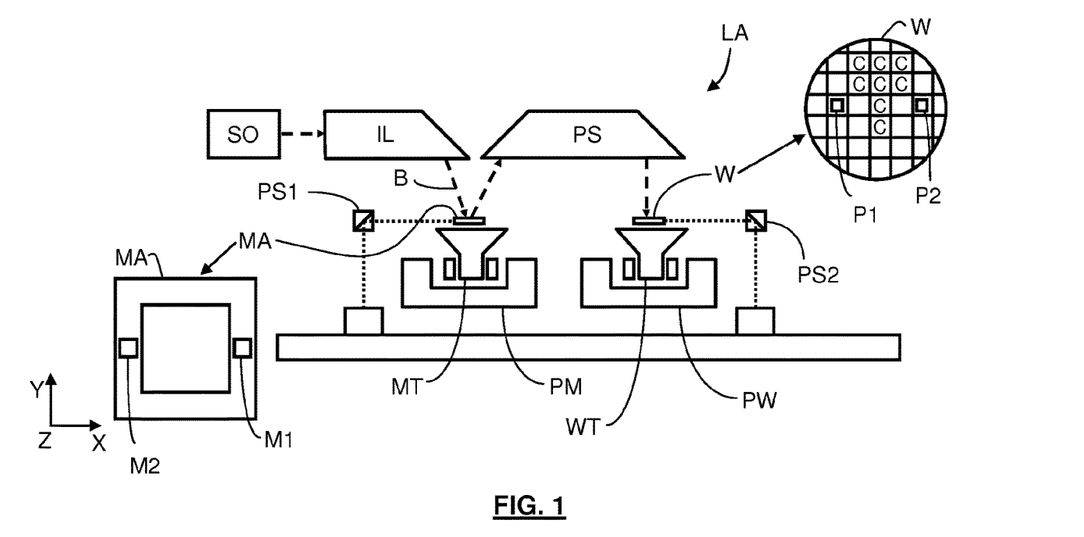
FIG. 1 depicts a lithographic apparatus.

FIG. 1 schematically depicts a lithographic apparatus LA including a radiation source according to one embodiment of the invention. The apparatus comprises:

- an illumination system IL configured to condition a radiation beam B (e.g. extreme ultraviolet (EUV) radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system IL may comprise a plurality of reflectors, such as for example a facetted field mirror and a facetted pupil mirror. The illumination system may be used to provide the radiation beam B with a desired angular intensity distribution and a desired spatial intensity distribution.

The support structure MT holds the patterning device MA in a manner that depends on the orientation of the patterning device, the design of the lithographic apparatus LA, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device is at a desired position, for example with respect to the projection system PS. The position of the support structure MT may be controlled by a positioner PM and a position sensor PS1 (e.g. an interferometric device, linear encoder or capacitive sensor). The positioner PM and the position sensor PS1 may together be used to accurately position the patterning device (e.g. mask) MA with respect to the path of the radiation beam B.

The term "patterning device" MA should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit. The patterning device MA may be transmissive or reflective. Examples of patterning devices include masks, programmable arrays (e.g. mirror arrays), and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the minor matrix.

As here depicted, the apparatus may be of a reflective type (e.g. employing a reflective mask).

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the radiation beam onto a target portion C of the substrate W. With the aid of a second positioner PW and a second position sensor PS2, the substrate table WT can be moved accurately, e.g. so as to position different target portions C in the path of the radiation beam B. Patterning device (e.g. mask) MA and substrate W may be aligned using mask alignment marks M1, M2 and substrate alignment marks P1, P2.

The depicted apparatus could be used for example in a scanning mode, wherein the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by (de-)magnification and image reversal characteristics of the projection system PS.

Alternatively, if the patterning device is a programmable array, the programmable array may be kept stationary and the substrate table WT may be moved while a pattern imparted to the radiation beam is projected onto a target portion C. A pulsed radiation source may be employed, with the programmable array being updated as required after each movement of the substrate table WT or in between successive radiation pulses. Other modes of operation of the lithographic apparatus LA, which may for example be a variation of this mode or the scanning mode, or an entirely different mode, may be used.

The projection system PS and the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum in the lithographic apparatus LA because a significant amount of EUV radiation is absorbed by gases. A vacuum environment may be provided to substantially the entire path of the radiation beam B in the illumination system IL and the projection system PS.

The lithographic apparatus LA may be of a type having two (dual stage) or more substrate tables WT (and/or two or more patterning device support structures MT). In such "multiple stage" machines, preparatory steps may be carried out on one or more substrate tables WT while one or more other substrate tables are being used for exposure. The preparatory steps may include for example measuring the surface topology of a substrate and measuring the positions of alignment marks on the substrate.

Referring to FIG. 1, the illumination system IL receives the EUV radiation beam B from a radiation source SO. The radiation source SO may be provided separately from the lithographic apparatus, such that the radiation source SO and the lithographic apparatus LA may be considered to be separate entities. Where this is the case, the radiation source SO and the lithographic apparatus LA may together be considered to be a lithographic system.

Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam (or more than one laser beam). The radiation source SO may be part of a radiation system including a laser, not shown in FIG. 1, for providing the laser beam exciting the fuel. The laser and the radiation source SO may be separate entities. The laser beam may be passed from the laser to the radiation source SO with the aid of a beam delivery system comprising, for example, suitable directing mirrors and/or a beam expander.

In an alternative method, often termed discharge produced plasma ("DPP") the EUV emitting plasma is produced by using an electrical discharge to convert the fuel to a plasma state. The fuel may be an element such as xenon, lithium or tin which has one or more emission lines in the EUV range. The electrical discharge may be generated by a power supply which may form part of the radiation source or may be a separate entity that is connected via an electrical connection to the radiation source SO.

Figure 2:
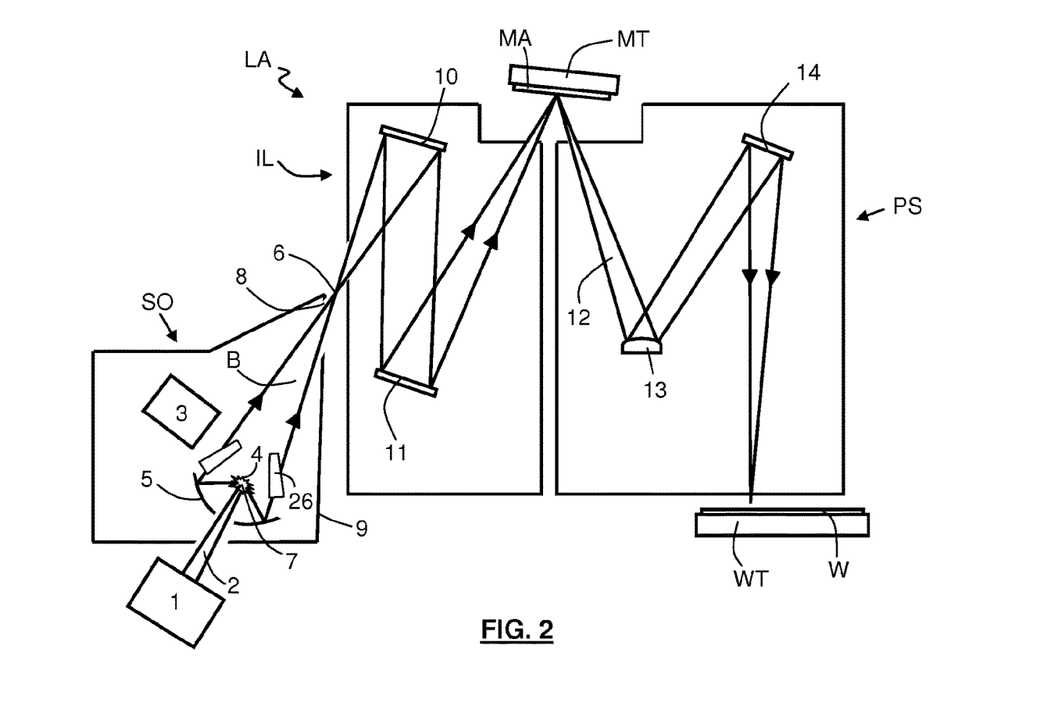
FIG. 2 depicts a lithographic system comprising a lithographic apparatus and a radiation source having a contamination trap according to an embodiment of the invention according to an embodiment of the invention.

FIG. 2 shows a lithographic system including a radiation source SO according to one embodiment of the invention. The lithographic system comprises the radiation source SO, and a lithographic apparatus LA which comprises an illumination system IL and a projection system PS. The radiation source SO, illumination system IL, and projection system PS are constructed and arranged such that a vacuum environment can be maintained within them. The lithographic apparatus LA may include elements which are illustrated in FIG. 1 and described above.

A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a highly ionized plasma 7 at the plasma formation region 4 which has electron temperatures of several tens of electron volts (eV). Radiation generated during de-excitation and recombination of the ions, including EUV radiation, is emitted from the plasma 7. The EUV radiation is collected and focused by a near normal incidence radiation collector 5 (sometimes referred to more generally as a normal incidence radiation collector). The collector 5 may have a multilayer structure, for example one tuned to reflect, more readily reflect, or preferentially reflect, radiation of a specific wavelength (e.g. radiation of a specific EUV wavelength). The collector 5 may have an elliptical configuration, having two ellipse focal points. A first focal point may be at the plasma formation region 4, and a second focal point may be at an intermediate focus 6, as discussed below.

A contamination trap 26 is located between the plasma formation region 4 and the radiation collector 20. The contamination trap 26 may be any suitable form of contamination trap. The contamination trap 26 may, in some embodiments, be provided by the inner walls of a vessel surrounding the plasma formation region 4.

The laser 1 may be separated from the radiation source SO. Where this is the case, the laser beam 2 may be passed from the laser 1 to the radiation source SO with the aid of a beam delivery system comprising, for example, suitable directing mirrors and/or a beam expander (not shown). The laser 1 and the radiation source SO may together be considered to be a radiation system.

A second laser (not shown) may be provided, the second laser being configured to preheat the tin before the laser beam 2 is incident upon it. An LPP source which uses this approach may be referred to as a dual laser pulsing (DLP) source. Such a second laser may be described as providing a pre-pulse into a fuel target, for example to change a property of that target in order to provide a modified fuel target. The change in property may be, for example, a change in temperature, size, shape or the like, and will generally be caused by heating of the fuel target.

Radiation B that is reflected by the radiation collector 5 is focused at point 6 to form an image of the plasma formation region 4, which in turn acts as a radiation source for the illuminator IL. The point 6 at which the radiation B is focused is commonly referred to as the intermediate focus, and the radiation source SO is arranged such that the intermediate focus 6 is located at or near to an opening 8 in an enclosing structure 9 of the radiation source.

Subsequently, the radiation B traverses the illumination system IL, which may include a facetted field mirror device 10 and a facetted pupil mirror device 11 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned radiation beam 12 is formed. The patterned radiation beam 12 is imaged by the projection system PS via reflective elements 13, 14 onto a substrate W held by the substrate table WT.

More elements than shown may generally be present in the illumination system IL and projection system PS. Furthermore, there may be more mirrors present than those shown in the figures. For example, there may be 1-6 additional reflective elements present in the projection system PS than shown in FIG. 2.

Figure 3:
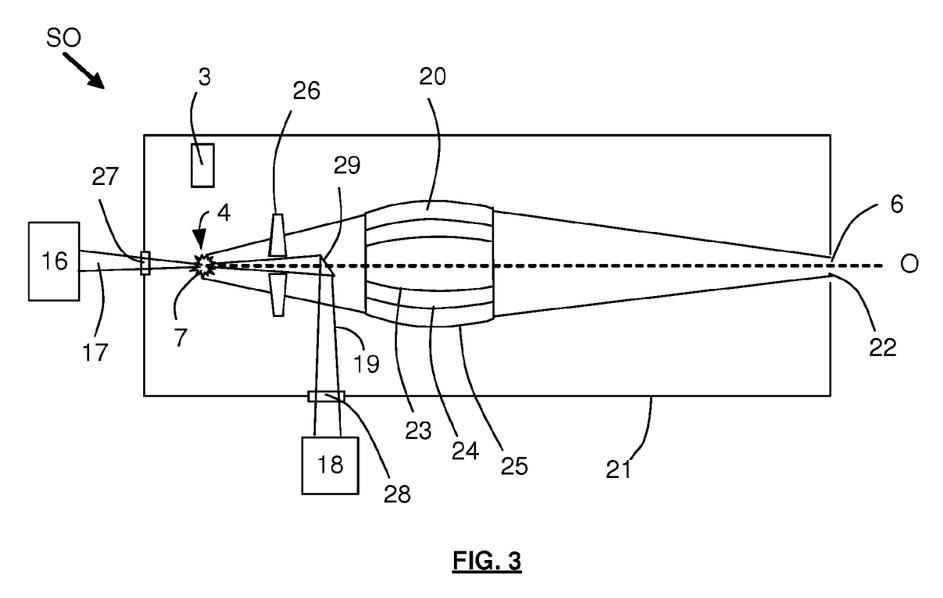
FIG. 3 depicts an alternative radiation source.

FIG. 3 shows a laser produced plasma (LPP) radiation source SO which has an alternative configuration to the radiation source shown in FIG. 2. The radiation source SO includes a fuel emitter 3 which is configured to deliver fuel to a plasma formation region 4. The fuel may for example be tin, and tin is referred to in the following description. However, any suitable fuel may be used. A pre-pulse laser 16 emits a pre-pulse laser beam 17 which is incident upon the tin. The pre-pulse laser beam 17 acts to preheat the tin, thereby changing a property of the tin such as its size and/or shape. A main laser 18 emits a main laser beam 19 which is incident upon the tin after the pre-pulse laser beam 17. The main laser beam delivers energy to the tin and thereby coverts the tin into an EUV radiation emitting plasma 7.

A radiation collector 20, which may be a so-called grazing incidence collector, is configured to collect the EUV radiation and focus the EUV radiation at a point 6 which is commonly referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to a lithographic apparatus illumination system. The radiation collector 20 is depicted as a nested collector with grazing incidence reflectors 23, 24 and 25. The grazing incidence reflectors 23, 24 and 25 are disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may be any suitable form of contamination trap. The contamination trap 26 may, in some embodiments, be provided by the inner walls of a vessel surrounding the plasma formation region 4.

The enclosure structure 21 includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 25 to the plasma formation region 4.

The radiation sources SO shown in FIGS. 2 and 3 may include components which are not illustrated. For example, a spectral filter may be provided in the radiation source. The spectral filter may be substantially transmissive for EUV radiation but substantially reflective for other wavelengths of radiation such as infrared radiation.

The radiation source SO, illumination system IL, and projection system PS are all provided in housings, e.g. as schematically depicted in FIG. 2. A vacuum may be provided in each of these housings, e.g. using vacuum pumps. Some gas may be provided in the radiation source SO, e.g. between the plasma formation region 4 and the collector 5, 20, the gas being arranged to act as a barrier which reduces the amount of fuel debris that is incident upon the collector.

As described above, fuel can be provided in the form of a liquid fuel, such as liquid tin. Problems may arise, however, from the use of liquid fuels. In particular, while a portion of the liquid fuel will be converted into a plasma, a significant amount of the liquid fuel may be ejected as particulate debris. Ejection of liquid fuel may occur as a result of the conversion into plasma itself, and, where droplet fuel targets are used, through interaction of subsequent fuel droplets with a previously generated plasma. Such particulate debris may be ejected at high speeds, and can lead to a number of problems within the radiation source SO. For example, the impact of particulate debris may corrode other components of the radiation source SO, such as the nozzle from which the liquid fuel is ejected, and the collector 5, 20.

Figure 4:
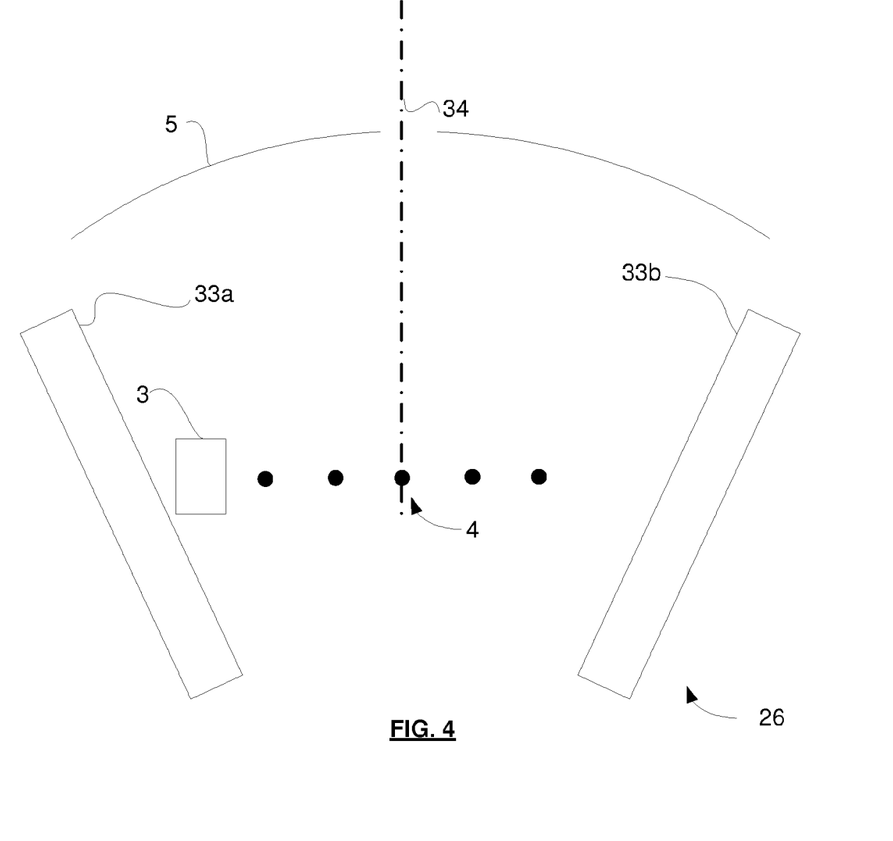
FIG. 4 depicts a contamination trap of the source of FIG. 2 or 3 in more detail.

As described above, the source SO may comprise a contamination trap 26. FIG. 4 illustrates parts of the radiation source SO in an embodiment of the invention. In the embodiment illustrated in FIG. 4 the contaminant trap 26 takes the form of a plurality vanes around the outside of the housing of the radiation source SO. Two vanes 33a, 33b are visible in FIG. 4. The vanes 33a, 33b are arranged to direct debris emitted by the plasma to one or more debris collection traps (not shown). The vanes 33a, 33b act to capture debris originating from the plasma generation process and to remove that debris to a location where it does not interfere with the operation of the source SO or the lithographic apparatus LA. Generally, debris is removed from the vanes of the contamination trap 26 in a liquid state, flowing along the vanes (e.g., under gravity) towards a container (not shown).

The vanes 33a, 33b are, in some embodiments of the invention, combined with other debris mitigation devices, for example a gas barrier. A gas barrier comprises a low background pressure of a suitable gas, e.g. argon, hydrogen or helium, and/or a stream of gas across the path of the radiation. A gas barrier in an embodiment of the invention is used only to provide mechanical suppression of debris. Therefore, a wide choice of suitable gasses is available.

In some known systems, the vanes 33a, 33b of the contamination trap 26 may be formed from stainless steel such as, for example, AISI/SAE steel grade 316 which contains, 2% Manganese (Mn) and 16-18% Chromium (Cr). AISI/SAE 316 is commonly utilised as it is easy to work. Manganese and Chromium form stable oxides on the surface of the vanes of the contamination trap 26 which cannot easily be reduced within the atmosphere of the source SO. Oxides formed on the vanes 33a, 33b negatively affect the wetting and flow properties of liquid debris which is incident on the vanes and can cause the debris to form droplets on the surface of the vanes. Where droplets form on the surface of the vanes, these can drip or otherwise be ejected (referred to herein as "spitting") from the vanes onto other optically-active components of the source SO, such as the collector 5, 20. Without wishing to be bound by any scientific theory, it is believed that the spitting effect arise as a result of nucleation of gas bubbles within the liquid fuel layer, where the gas bubbles arise from gas free-radicals reacting with the fuel, and the reaction product subsequently decomposing to form gas bubbles, within the liquid fuel layer. The gas diffusion out of the liquid at low temperatures is too slow to prevent nucleation of gas bubbles within the liquid fuel. It is thought the eruption of such gas bubbles from the liquid fuel layer leads to the spitting phenomenon. Such gas free-radicals are formed when a radical-forming gas such as hydrogen is present within the enclosure of the radiation source, the free-radicals arising from interaction between the gas and the plasma and/or radiation, such as EUV radiation, generated by the plasma.

Such dripping or spitting may negatively effects the operation and operating lifetime of the source SO. It is therefore desirable to reduce or prevent the contamination of optically-active surfaces by fuel particles which may arise as secondary debris by dripping or spitting from liquid fuel layers. The term "layer" as used herein in this context term includes any portions liquid fuel which are sufficient in volume and/or surface area to drip under gravity or to generate spitting.

In some embodiments of the present invention, at least a portion of the vanes 33a, 33b that is exposed to liquid fuel debris (i.e., a debris receiving surface) is formed of a material that reacts with the liquid fuel debris to form an intermetallic layer. The debris receiving surface may be an outer portion of the vanes 33a, 33b and may be provided by a coating. Alternatively, the entirety of the vanes structure may be constructed from the same material as the debris receiving surface. The intermetallic layer may have a melting point which is higher than the operating temperature of the source SO within the region of the contamination trap 26. For example, in some embodiments the intermetallic layer may have a melting point of greater than 200 degrees Celsius, and in some embodiments greater than 500 degrees Celsius. For example, in an embodiment, the liquid fuel may be tin, and the vanes 33a, 33b may be composed of carbon steel.

In one embodiment, liquid fuel, in the form of tin, is deposited on the vanes 33a, 33b at a rate of the order of 0.4 µm per billion pulses (Giga pulses—Gp) of the initiating laser beam (e.g., the laser beams 2, 19). The number of Giga pulses per period of time may vary. For example, in some embodiments, pulses may be emitted at a rate of 270 Gp/year. In other embodiments, pulses may be emitted at a rate of 750 Gp/year. It will be appreciated, however, that the rate of pulses may vary in dependence upon particular applications.

Laser pulses may, in some embodiments, be produced at a rate of approximately 1 Gp per day during a continuous six hour period. That is, in some systems, laser pulses may not be generated continuously, but rather may be generated for a portion of the day (e.g., a working part of the day, which may be six hours) but not produced at others. It will be appreciated, however, that in other systems, the generation of laser pulses may be different. For example, laser pulses may be produced over more or fewer hours during a day, or may be produced continuously (with the exception of scheduled or unscheduled "downtime"). Additionally, in some embodiments, some droplets of fuel are not utilized to produce EUV radiation (i.e., not every droplet of fuel is excited by a laser beam pulse). As such, in some embodiments, "used" laser pulses (i.e. those which are incident on a fuel droplet) may be produced at a rate of approximately 0.75 Gp per day, where laser pulses are only produced over six hour periods each day. In such an embodiment, liquid fuel debris may be deposited on the debris receiving surface of the contamination trap 26 at a rate of approximately 0.4 µm per day (or at a rate of approximately 0.067 µm per hour during the operational six hours). It will be appreciated that the units "µm per hour" indicate a flux and may be equivalently be expressed as a volume of fuel per unit area of the debris receiving surface per unit of time.

As indicated above, it is desirable to prevent the liquid fuel debris from forming a liquid film on the debris receiving surface. In one embodiment, the material of the debris receiving surface is selected so as to have a reaction rate with the liquid fuel debris which prevents a liquid film from forming, and therefore preventing liquid fuel from dripping or spitting from the debris receiving surface. In one embodiment, the material of the debris receiving surface is selected so as to have a reaction rate with the liquid fuel debris of the order of twice the rate at which the liquid fuel debris is deposited on the debris receiving surface (the deposition rate). It has been found that a reaction rate that is at least twice the deposition rate is sufficient to prevent a liquid film from forming on the debris receiving surface. As such, in some embodiments, the material of the debris receiving surface is selected to have a reaction rate of approximately 1 µm per day (or at least approximately 0.16 µm per hour).

It will be appreciated that while the above embodiments describe the presence of vanes 33a, 33b, such vanes are not an essential feature of the invention. Indeed, by providing a debris receiving surface which forms an intermetallic layer with by reacting with liquid fuel debris, the vane structure may be simplified or omitted from the debris receiving surface entirely. In more detail, where the liquid fuel debris does not form an intermetallic layer on the debris receiving surface, it may be desirable for the vanes to comprise sharp edges and to be angled so as to control scattering of debris upon impact with the vanes. Additionally, vanes may be heated so as to facilitate flow of the debris along the vanes to a collector. In embodiments described herein, however, other vane designs may be considered because the reaction with the debris to form an intermetallic layer will reduce the scattering behaviour of the fuel debris which impacts on the debris receiving surface. For example, the vanes may not be required to have sharp edges, thereby reducing manufacturing cost, complexity and improving robustness. Additionally, vanes may be omitted entirely such that the debris receiving surface of the contamination trap 26 is provided by a smooth surface positioned within the source SO to receive fuel debris emitted from the plasma formation region 4.

It will be appreciated that all other factors being equal (e.g., circumference, length, etc.), a smooth debris receiving surface will have a smaller surface area than a debris receiving surface that provides vanes. By way of example only, a smooth debris receiving surface may have a surface area of the order of eight times smaller than that of a debris receiving surface provided by a plurality of vanes. Using the exemplary pulse rate of 0.75 Gp per six hours, a deposition rate of 4 µm during a six hour period (or 0.67 µm per hour) may therefore be expected on a smooth (e.g., non-vaned) debris receiving surface. This provides a desired reaction rate of order of 1.33 µm per hour. It will be appreciated that, for some applications (for example where more pulses per hour are produced), it may be desirable to provide a faster reaction rate. Further, it is to be understood that the reaction rates described above are "initial reaction rates" and that the reaction rate of the debris receiving surface will decrease as the intermetallic layer develops. It may therefore be beneficial to provide a higher reaction rate to compensate for a slowing of the reaction rate over time.

Generally, the atmosphere and temperature in the source SO has relatively little influence on the reaction speed in comparison to the material and the temperature of the debris receiving surface.

It is described above that in an embodiment, the debris receiving surface may be constructed from carbon steel. Where carbon steel is used for the debris receiving surface and the liquid fuel is tin, the liquid tin debris reacts with the vanes to form $FeSn_2$, having a melting point of 513 degrees Celsius. A suitable steel is steel grade S235JR, as defined by EN 10025-2:2004, European standard for hot-rolled structural steel. Carbon steel S235JR has a reaction rate with tin of approximately 1.5 µm per hour at 360 degrees Celsius. Carbon steel also has better heat conductivity than, for example, stainless steel, leading to better thermal control of the debris receiving surface. Further, carbon steel is less expensive than stainless steel, leading to reduced manufacturing costs.

While carbon steel is provided as an example above, it will be apparent to the skilled person from the teaching herein that other materials may be used. For example, where the liquid fuel is tin, other materials include pure iron (Fe) copper (Cu) and Nickle (Ni), each of which react with tin to form intermetallic alloys. More generally, it will be appreciated that other materials will be suitable. Generally, those materials which do not form oxides on the debris receiving surface are preferred.

The reaction rate of the debris receiving surface may be improved further by heating the debris receiving surface. In some embodiments, therefore, heating elements are provided to raise the temperature of the debris receiving surface and thereby increase the reaction rate with the liquid fuel debris. For example, in some embodiments, the debris receiving surface may be heated to a temperature of 300 degrees Celsius or higher. In other embodiments, the debris receiving surface may be heated to a temperature of 500 degrees Celsius. It has been found that the reaction rate of iron with liquid tin to form $FeSn_2$ is approximately ten times (10×) greater when the iron is heated to 500 degrees Celsius, compared to iron that is heated to 300 degrees Celsius.

It has been described above that the debris receiving surface may be smooth. In alternative embodiments, the debris receiving surface may be porous, so as to enlarge the effective surface area. For example, the debris receiving surface may be have the structure of a mesh, a foam, fused grains, wires, or may use any other appropriate techniques for enlarging the surface area.

From the above it will be appreciated that there is provided improved contamination traps for dealing with debris caused by liquid fuel. In described embodiments, rather than relying solely upon capturing the debris (e.g., on vanes) and removing the captured debris in liquid form, liquid fuel debris may be captured at the debris receiving surface of the contamination trap and reacted to form an intermetallic layer. The intermetallic layer may have a high melting point and may persevere for the operational lifetime of the contamination trap.

In an embodiment, surfaces within the source SO may be treated to form an intermetallic layer during manufacture or maintenance, such that the treated surfaces are already resistant to tin prior to use of the source SO (or prior to re-use after maintenance). In an embodiment, one or more surfaces within the source comprising materials and alloys that contain, for example, at least one of iron (Fe), nickel (Ni), cobalt (Co) or molybdenum (Mo) can be treated by boronizing (also referred to as bonding). As will be known to those skilled in the art, boronizing is a surface hardening diffusion process by which boron is introduced to the outer surfaces of the part at high temperatures (e.g., 900 degrees C.). Boronizing may occur over a relatively long period of time (e.g., 3 to 5 hours). Due to the high temperatures and the long diffusion time boron atoms will diffuse into the surface of the material such that inside the diffusion penetration depth (i.e., the depth to which the boron atoms diffuse), the treated material becomes an intermetallic of the constituent metal(s) of the treated material and boron. For example, intermetallics such as nickel monoboride (NiB), nickel boride ($Ni_2B$), iron monoboride (FeB), iron boride ($Fe_2B$), molybdenum monoboride (MoB), molybdenum boride ($Mo_2B$), cobalt monoboride (CoB), cobalt boride ($Co_2B$) may be created. Intermetallics created through boronization are very stable, even at high temperatures and are substantially non-wetting for liquid tin. Additionally, intermetallics created through boronization are very resistant to molten metals such as aluminium and zinc. Additionally, intermetallics created through boronization are very hard, scratch resistant and durable. Additionally, intermetallics created through boronization do not suffer from oxidation at high temperatures. Further, intermetallics created through boronization of internal surfaces of the source SO may be made to fully envelope a surface and may be made defect-free, thereby preventing weak points within a surface which may otherwise allow liquid tin to ingress and damage the surface.

In an embodiment, a stop-off paint or other masking technique may be used to selectively applying the boronizing treatment to only parts of a surface or element within the source SO. Selectively boronizing a surface or element allows for the creation of elements that have surfaces that are non-wetting (boronized) and other surfaces on the same element that are wetting (non-boronized).

In an embodiment, a capping layer may be applied to optical surfaces (i.e., surfaces of an optical element such as a mirror) that are positioned within the path of the EUV radiation beam B) within the lithographic system (such as, for example, the collector 5, the mirrors 10, 11, 13 and 14). The capping layer is subsequently boronized to protect the optical element from contamination and damage caused by liquid tin. This protection of the optical surface is due to the presence of a top layer that comprises an intermetallic surface-layer. The capping layer may comprise, for example, molybdenum (Mo), nickel (Ni), iron (Fe) or cobalt (Co). In an alternative embodiment, where the optical element comprises a multilayer, and where the top (i.e. surface) layer is a suitable material, the top layer may be boronized directly, without the application of an additional capping layer.

Figure 5:
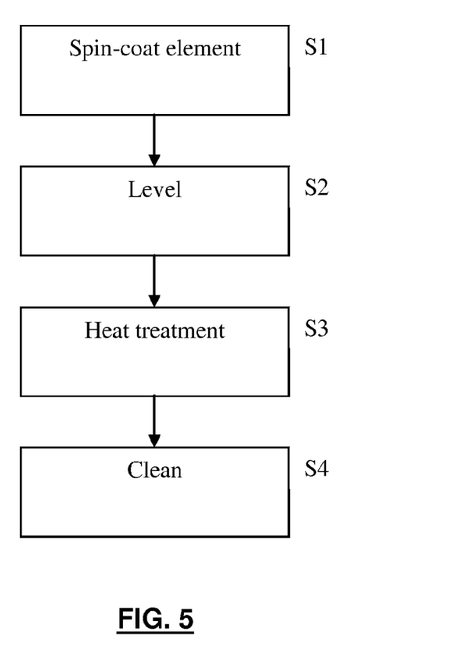
FIG. 5 is a flowchart showing example processing that may be carried out to boronize an optical element.

FIG. 5 is a flowchart illustrating an example process by which an element having an optical surface within the lithographic system may be protected through boronization. It is assumed in FIG. 5 that a top layer of the optical surface of the element (e.g. mirror) comprises a material that is suitable for boronization (such as molybdenum (Mo), nickel (Ni), iron (Fe) or cobalt (Co)). For example, the element may already have a top layer suitable for boronization, or an additional capping layer may be applied as described above.

At a step S1 the element is spin-coated with a solution containing boronizing agents. For example, a dedicated boranizing powder suitable for the material of the top (or capping) layer of the element (e.g. a boronizing powder for molybdenum) may be mixed into a solution of water, alcohol or other solvent to create the solution. The element is spun until the solution has dried-up and formed a 'boronizing layer' on top of the optical surface of the element. The spinning during step S1 counteracts the forces of gravity such that the solution will evenly coat the optical surface of the element.

At step S2 the boronizing layer is processed to provide a uniform, level, boronizing layer over the optical surface. By way of example only, a turning, sanding or other scraping method may be used to reduce the thickness of areas of the boronizing layer.

At step S3, the boronizing layer is subjected to heat in order to "burn off" the boronizing layer in short but high intensity bursts. For example, a suitable laser may be used. The boronizing agents within the boronizing layer react with the top (or capping) layer of the optical surface to form an intermetallic layer (e.g. molybdenum boride). The wavelength of the laser may be tuned to the particular colour of the boronizing layer in order to maximize the energy transfer of the laser into the boronizing layer.

The boronizing layer should be thick enough to protect the multi-layer from being penetrated (and thereby harmed) by the laser, but also thin enough to allow the boronising agents to react with the top (or capping) layer of the optical surface to form a continuous intermetallic layer. It will be appreciated that the duration and intensity of the laser bursts may tuned to the release and interaction of the boronizing agents with the top (or capping) layer. In an embodiment, an 'overlapping' or 'stitching' method is used during step S3 during which the laser beam is traversed along the whole optical surface of the element to ensure that the entire surface is heated.

At step S4, once the whole surface of the element has been treated, the remains of the boronizing layer are removed. For example, the boronizing layer remains may be removed mechanically. For example, the boronizing layer may be subjected to "blasting" by "$CO_2$ snow" or to washing in, e.g., alcohol or water.

It will be appreciated that the process set out in FIG. 5 with respect to the boronization of an element having an optical surface may also be used for other elements within a lithographic system, such as, for example, vanes of a debris mitigation system.

Although specific reference may be made in this text to embodiments of the invention in the context of a lithographic apparatus, embodiments of the invention may be used in other applications. For example, embodiments of the invention may form part of a mask inspection apparatus (e.g. an aerial image inspection apparatus), a wafer inspection apparatus, or a metrology apparatus. More generally, embodiments of the invention may form part of any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. The lithographic tool may for example be a plasma etching apparatus or a deposition apparatus. The lithographic tool may for example be a track (a tool that typically applies a layer of resist to a substrate and develops the exposed resist).

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate may be processed more than once, for example in order to create a multi-layer IC, so that the term substrate used herein may also refer to a substrate that already contains multiple processed layers.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A debris mitigation system for use in a radiation source, comprising:
a contamination trap comprising a debris receiving surface configured to receive liquid metal fuel debris emitted from a plasma formation region of the radiation source,
wherein the debris receiving surface is constructed from a material that reacts with the liquid metal fuel debris and forms an intermetallic layer on the debris receiving surface under conditions maintained by the debris mitigation system.

2. The debris mitigation system of claim 1, wherein the reaction is such that substantially no liquid fuel drips from the debris receiving surface.

3. The debris mitigation system of claim 1, wherein the material reacts with the liquid metal fuel debris at a rate of at least twice that at which the liquid metal fuel debris is deposited on the debris receiving surface.

4. The debris mitigation system of claim 1, wherein a rate of reaction between the liquid metal fuel debris and the debris receiving surface is greater than 0.15μm per hour.

5. The debris mitigation system of claim 1, wherein the intermetallic layer has a melting point in excess of 200 degrees Celsius or in excess of 500 degrees Celsius.

6. The debris mitigation system of claim 1, wherein the material reacts with tin to form the intermetallic layer.

7. The debris mitigation system of claim 1, wherein the debris receiving surface is constructed from iron, an iron alloy, carbon steel, nickel, or copper.

8. The debris mitigation system of claim 1, wherein the debris receiving surface is formed with a porous structure.

9. The debris mitigation system of claim 1, wherein the debris receiving surface comprises a plurality of vanes.

10. The debris mitigation system of claim 1, wherein the debris receiving surface is substantially smooth.

11. The debris mitigation system of claim 1, further comprising: a heat source configured to heat the debris receiving surface to an operating temperature of between 200-500 degrees Celsius.

12. A radiation source comprising:
a fuel emitter configured to provide a fuel target to a plasma formation region; and
a debris mitigation system configured to be used in the radiation source, the debris migration system comprising:
a contamination trap comprising a debris receiving surface configured to receive liquid metal fuel debris emitted from the plasma formation region,
wherein the debris receiving surface is constructed from a material that reacts with the liquid metal fuel debris to form an intermetallic layer on the debris receiving surface under conditions maintained by the debris mitigation system.

13. The radiation source of claim 12, wherein fuel emitter is configured to emit liquid tin.

14. A radiation system comprising:
a radiation source comprising:
a fuel emitter configured to provide a fuel target to a plasma formation region of the radiation source;
a debris mitigation system configured to be used in the radiation source, the debris migration system comprising:
a contamination trap comprising a debris receiving surface configured to receive liquid metal fuel debris emitted from the plasma formation region,
wherein the debris receiving surface is constructed from a material that reacts with the liquid metal fuel debris and forms an intermetallic layer on the debris receiving surface; under conditions maintained by the debris mitigation system and
a first laser configured to provide a first laser beam at the plasma formation region to impact the fuel target and generate a radiation emitting plasma.

15. A lithographic system comprising:
a radiation source comprising:
a fuel emitter configured to provide a fuel target to a plasma formation region of the radiation source;
a debris mitigation system configured to be used in the radiation source, the debris migration system comprising:
a contamination trap comprising a debris receiving surface configured to receive liquid metal fuel debris emitted from the plasma formation region,
wherein the debris receiving surface is constructed from a material that reacts with the liquid metal fuel debris and forms an intermetallic layer on the debris receiving surface; under conditions maintained by the debris mitigation system
an illumination system configured to condition a radiation beam from the radiation source;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

16. A system comprising:
a radiation source comprising a fuel emitter configured to provide a fuel target to a plasma formation region, the radiation source comprising a first surface of a debris mitigation system and a second surface that both receive, during use, liquid metal fuel debris, the first and second surfaces each comprising an intermetallic layer formed by boronization, and the radiation source producing a radiation beam; and
a lithographic system, comprising:
an illumination system configured to condition the radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

17. The system of claim 16, wherein:
the lithographic system comprises the radiation source;
the radiation source comprises a radiation collector; and the second surface comprises a surface of the radiation collector.

18. The system of claim 16, wherein the second surface comprises an optical surface of an optical element.

19. The system of claim 16, wherein the intermetallic layer comprises nickel monoboride (NiB), nickel boride ($Ni_2B$), iron monoboride (FeB), iron boride ($Fe_2B$), molybdenum monoboride (MoB), molybdenum boride ($Mo_2B$), cobalt monoboride (CoB), or cobalt boride ($Co_2B$).

20. The debris mitigation system of claim 1, wherein the liquid metal fuel debris do not form a liquid film on the debris receiving surface.

* * * * *

UNITED STATES PATENT AND TRADEMARK OFFICE
CERTIFICATE OF CORRECTION

PATENT NO. : 10,990,015 B2  
APPLICATION NO. : 16/318303  
DATED : April 27, 2021  
INVENTOR(S) : Michel Riepen et al.

Page 1 of 1

It is certified that error appears in the above-identified patent and that said Letters Patent is hereby corrected as shown below:

In the Claims

In Column 15, Line 58, replace "migration" with --mitigation--.
In Column 16, Line 8, replace "migration" with --mitigation--.
In Column 16, Line 16, replace "surface; under" with --surface under--.
In Column 16, Line 17, replace "system and" with --system; and--.
In Column 16, Line 27, replace "migration" with --mitigation--.
In Column 17, Line 11, replace "do not" with --does not--.

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*